US011222966B2

(12) United States Patent
Kawamura et al.

(10) Patent No.: US 11,222,966 B2
(45) Date of Patent: Jan. 11, 2022

(54) SEMICONDUCTOR DEVICE AND SEMICONDUCTOR MODULE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Keiko Kawamura, Yokohama Kanagawa (JP); Tomoko Matsudai, Shibuya Tokyo (JP); Yoko Iwakaji, Meguro Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 23 days.

(21) Appl. No.: 16/801,908

(22) Filed: Feb. 26, 2020

(65) Prior Publication Data

US 2021/0066480 A1 Mar. 4, 2021

(30) Foreign Application Priority Data

Aug. 30, 2019 (JP) .............................. JP2019-158729

(51) Int. Cl.
*H01L 29/739* (2006.01)
*H01L 29/36* (2006.01)
*H01L 29/45* (2006.01)
*H03K 17/16* (2006.01)
*H01L 29/08* (2006.01)
(Continued)

(52) U.S. Cl.
CPC ...... *H01L 29/7397* (2013.01); *H01L 29/0804* (2013.01); *H01L 29/0821* (2013.01);
(Continued)

(58) Field of Classification Search
CPC ..... H01L 29/7397; H01L 29/36; H01L 29/45; H01L 29/0821; H01L 29/1004;
(Continued)

(56) References Cited

U.S. PATENT DOCUMENTS 5,894,149 A * 4/1999 Uenishi ............... H01L 29/0696
257/331
6,392,272 B1 * 5/2002 Hasegawa ......... H01L 29/66348
257/329
(Continued)

FOREIGN PATENT DOCUMENTS

JP 2012138567 A 7/2012
JP 2015072950 A 4/2015
JP 6407455 B2 10/2018

*Primary Examiner* — Syed I Gheyas
(74) *Attorney, Agent, or Firm* — Kim & Stewart LLP

(57) ABSTRACT

A semiconductor device includes first and second electrodes. A first-type layer is between the first and second electrodes. A pair of first gate electrodes is between the first and second electrodes and each is surrounded by a gate insulating film. Second gate electrodes are disposed between the pair of first gate electrodes. A second-type layer is on the first-type layer in a first region between a first gate electrode and one of the second gate electrodes. Another first-type layer is on the second-type layer. This other first-type layer is directly adjacent to the gate insulating film. Another second-type layer is on the other second-type layer. A width of the first-type layer between adjacent second gate electrodes is less than a length of the first-type layer in the region between adjacent second gate electrodes.

20 Claims, 17 Drawing Sheets

(51) Int. Cl.
*H01L 29/10* (2006.01)
*H01L 29/417* (2006.01)

(52) U.S. Cl.
CPC .......... *H01L 29/1004* (2013.01); *H01L 29/36* (2013.01); *H01L 29/41708* (2013.01); *H01L 29/45* (2013.01); *H03K 17/168* (2013.01)

(58) Field of Classification Search
CPC .......... H01L 29/41708; H01L 29/0804; H01L 29/47; H01L 29/1095; H01L 29/0696; H01L 29/407; H01L 29/7398; H01L 29/7396; H01L 29/42356; H01L 29/4236; H01L 29/0684; H03K 17/168
See application file for complete search history.

(56) References Cited

U.S. PATENT DOCUMENTS

| | | |
|---|---|---|
| 8,614,483 B2 | 12/2013 | Tanabe et al. |
| 10,192,978 B2 | 1/2019 | Okuda et al. |
| 10,439,054 B2 | 10/2019 | Ogura et al. |
| 10,811,524 B2 | 10/2020 | Iwakaji et al. |
| 10,903,348 B2 | 1/2021 | Matsuda et al. |
| 2004/0207009 A1* | 10/2004 | Yamaguchi ......... H01L 29/0839 257/329 |
| 2005/0032291 A1* | 2/2005 | Baliga ................. H01L 29/872 438/212 |
| 2012/0146091 A1* | 6/2012 | Tanabe ................ H01L 29/1095 257/139 |
| 2014/0054644 A1* | 2/2014 | Hikasa ............. H01L 29/66348 257/139 |
| 2015/0091055 A1 | 4/2015 | Gejo et al. |
| 2015/0144988 A1* | 5/2015 | Laven ................. H01L 29/407 257/139 |
| 2015/0155277 A1* | 6/2015 | Ogura ................ H01L 29/1095 257/140 |
| 2017/0092750 A1* | 3/2017 | Nagata ................ H01L 29/407 |
| 2018/0204909 A1 | 7/2018 | Konishi et al. |
| 2019/0296133 A1 | 9/2019 | Iwakaji et al. |
| 2020/0091323 A1 | 3/2020 | Iwakaji et al. |

\* cited by examiner

FIG. 4

| TIME | T0 | T1 | T2 | T3 |
|---|---|---|---|---|
| OPERATING STATE OF SEMICONDUCTOR DEVICE | OFF | TURN ON | FIRST TURN-OFF (ON) | SECOND TURN-OFF |
| CONTROL SIGNAL S | L s | H s | L s | L s |
| FIRST GATE VOLTAGE Vg1 | Lg 1 | Hg 1 | Hg 1 | Lg 1 |
| SECOND GATE VOLTAGE Vg2 | Lg 2 | Hg 2 | Lg 2 | Lg 2 |

SEMICONDUCTOR DEVICE AND SEMICONDUCTOR MODULE

CROSS-REFERENCE TO RELATED APPLICATION(S)

This application is based upon and claims the benefit of priority from. Japanese Patent Application No. 2019-158729, filed Aug. 30, 2019, the entire contents of which are incorporated herein by reference.

FIELD

Embodiments described herein relate generally to a semiconductor device and a semiconductor module.

BACKGROUND

Insulated gate bipolar transistors (IGBTs) are widely used as power semiconductor devices that control a large current and have a high breakdown voltage. The IGBT is generally used as a switching element. In an IGBT being used as a power semiconductor device, it is desirable that switching loss is small.

DESCRIPTION OF THE DRAWINGS

FIG. 4 is a table showing values of a control signal, a first gate voltage, and a second gate voltage at each time point.

DETAILED DESCRIPTION

Figure 1A:
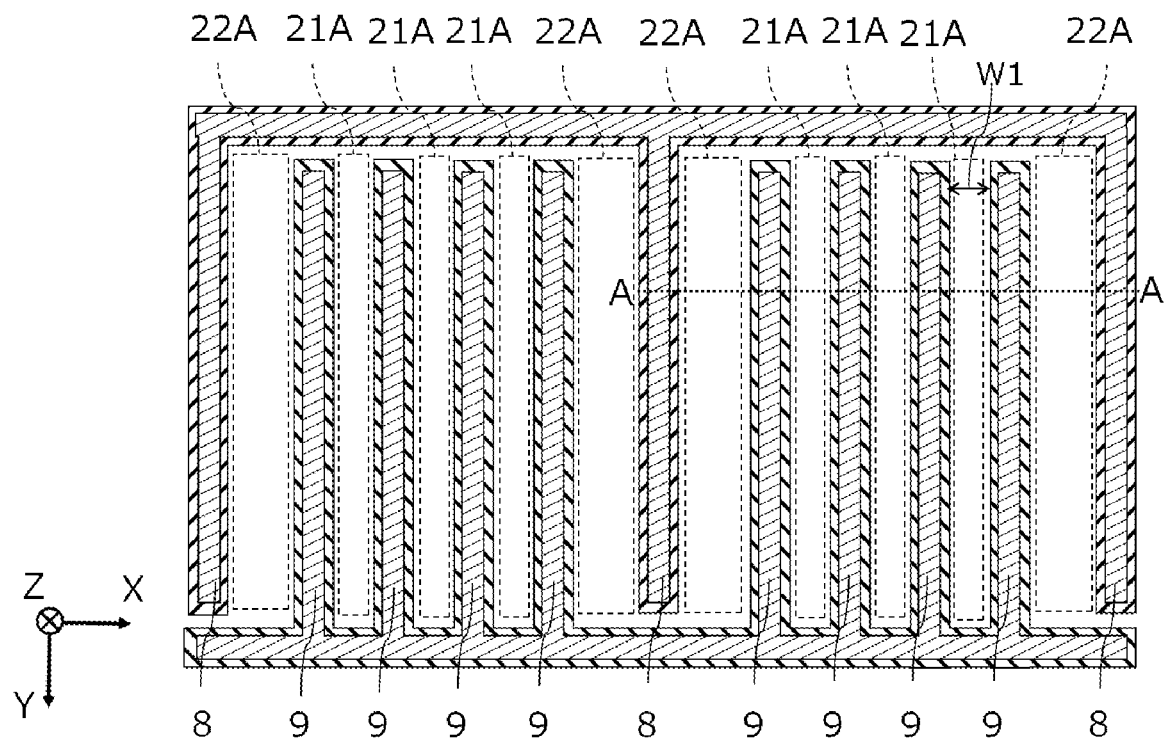
FIG. 1A is a schematic plan view depicting a semiconductor device according to a first embodiment in which electrodes are arranged in a comb pattern.

Certain embodiments provide a semiconductor device and a semiconductor module in which switching losses can be reduced.

In general, according to one embodiment, a semiconductor device includes a first electrode spaced from a second electrode in a first direction. A first semiconductor layer of a first conductivity type is between the first and second electrodes. A first pair of first gate electrodes is between the first and second electrodes and spaced from each other in a second direction intersecting the first direction. Each first gate electrode extends in the first direction into the first semiconductor layer and is surrounded by a first gate insulating film. A plurality of second gate electrodes is between the first pair of first gate electrodes in the second direction and are spaced from each other in the second direction. Each second gate electrode extends in the first direction between the first and second electrodes and is surrounded by a second gate insulating film. A second semiconductor layer of a second conductivity type on the first semiconductor layer is in a first region that is between a first gate electrode of the first pair and one of the plurality of second gate electrodes. A third semiconductor layer is of the first conductivity type on the second semiconductor layer and directly adjacent to the first gate insulating film. A fourth semiconductor layer of the second conductivity type is on the second semiconductor layer adjacent to the third semiconductor layer in the second direction. A width of the first semiconductor layer in a second region between adjacent pairs of the second gate electrodes in the second direction is less than a length of the first semiconductor layer in the second region.

Hereinafter, semiconductor devices according to example embodiments will be described with reference to the drawings. The present disclosure is not limited to these example embodiments. The views of the semiconductor devices used in description of the following embodiments are schematic, and the relationship between thickness and width of layers and a ratio of the thicknesses of each layer are not limited to those depicted in the drawings. Even when representing the same portion or aspect in different figures, dimensions and ratios may be differently represented depending on the drawings.

In the present specification and drawings, those element or aspects that are substantially the same as those already described are denoted by the same reference numerals in different drawings, and description thereof may be omitted.

In the description of the present specification, the notation N⁺, N, N⁻ and P⁺, P reflects a relative level of carrier concentration of each conductivity type in a region/portion/element so designated. That is, N⁺ notation indicates an N type carrier concentration that is relatively higher than N notation, and N⁻ notation indicates an N type carrier concentration that is relatively lower than N notation. Similarly, P⁺ notation indicates a P type carrier concentration that is relatively higher than a P notation.

In the present specification, a distribution and an absolute value of the carrier concentration in a semiconductor region can be measured using, for example, secondary ion mass spectrometry (SIMS). In addition, a relative relationship between carrier concentrations of two semiconductor regions can be determined using, for example, scanning capacitance microscopy (SCM). In addition, the distribution and the absolute value of the carrier concentration can be measured using, for example, spreading resistance analysis (SRA).

First Embodiment

Figure 1B:
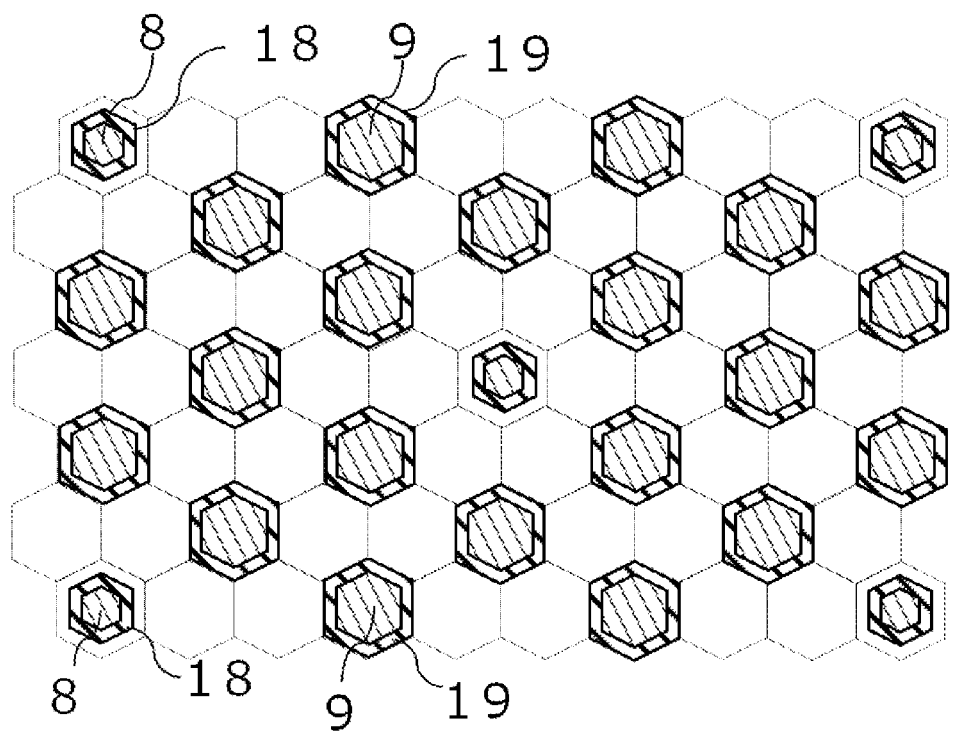
FIG. 1B is a schematic plan view depicting a semiconductor device according to a first embodiment in which electrodes are arranged in a hexagonal pattern.
Figure 2:
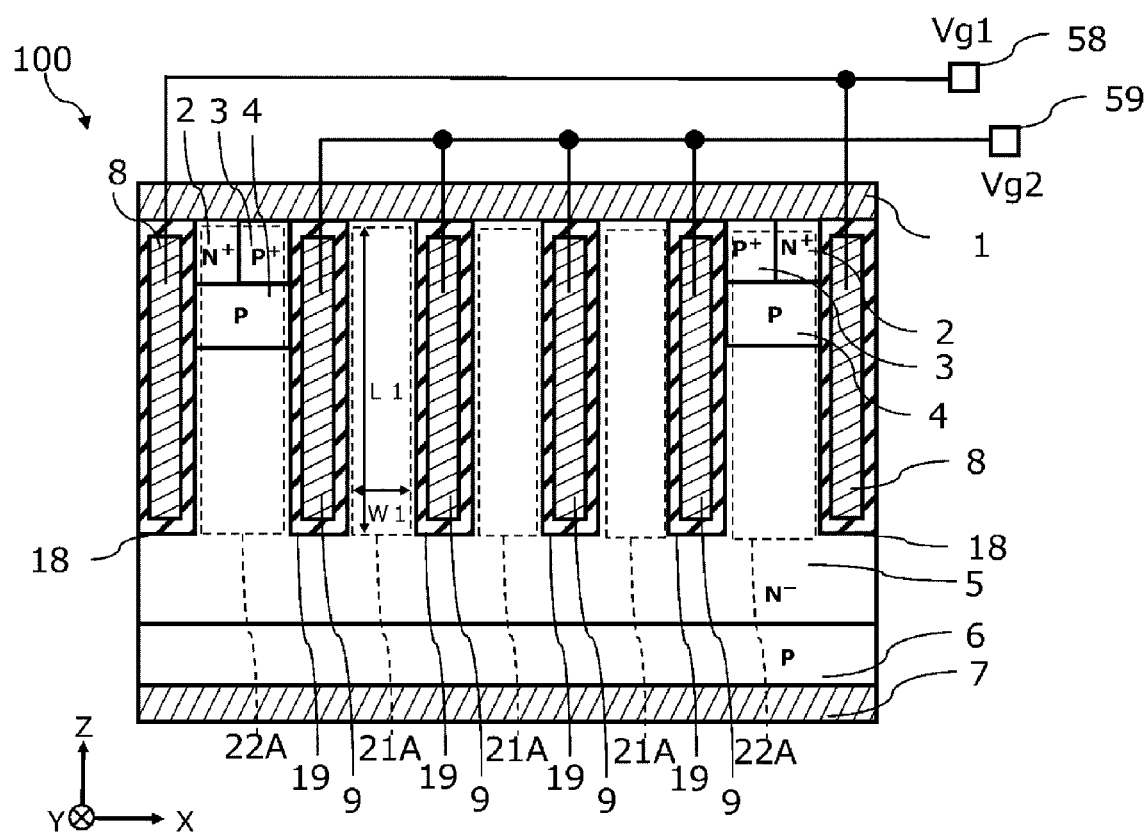
FIG. 2 is a schematic cross-sectional view showing a configuration of a semiconductor device according to a first embodiment.

A semiconductor device 100 according to a first embodiment will be described with reference to FIG. 1A, FIG. 1B and FIG. 2. FIG. 1A is a schematic plan view of a semiconductor device 100 according to the first embodiment in which electrodes are arranged in a comb pattern. FIG. 1B is a schematic plan view depicting a semiconductor device according to a first embodiment in which electrodes are arranged in a hexagonal pattern rather than a comb pattern. FIG. 2 is a schematic cross-sectional view showing a configuration of the semiconductor device 100 according to the first embodiment taken at the line A-A in FIG. 1A. A cross-sectional view along a line of symmetry in the hexagonal pattern of FIG. 1B would also be similar to that depicted in FIG. 2. As shown in FIG. 2, the semiconductor device 100 according to the first embodiment includes an emitter electrode 1, N⁺ type emitter layers 2, P⁺ type contact layers 3, P type base layers 4, an N⁻ type base layer 5, a P type collector layer 6, a collector electrode 7, first gate electrodes 8, second gate electrodes 9, first insulating films 18, and second insulating films 19. Each semiconductor layer is, for example, silicon, but is not limited to silicon. The semiconductor device 100 is an IGBT.

In the description below, a direction from the collector electrode 7 to the emitter electrode 1 is a Z direction, one of directions orthogonal to the Z direction is an X direction, and a direction orthogonal to the Z direction and the X direction is a Y direction.

The emitter electrode 1 contains a metal that exhibits Schottky characteristics with respect to an N type semiconductor. For example, the emitter electrode 1 is made of a material containing at least one material selected from a group of Al, Ta, Ag, Mo, W, Co, Cr, Ru, Au, Pd, Ni, and Pt.

A metal is used for the collector electrode 7.

The P type collector layer 6 is a P type semiconductor layer provided between the emitter electrode 1 and the collector electrode 7. The P type collector layer 6 is electrically connected to collector electrode 7.

The N⁻ type base layer 5 is an N type semiconductor layer provided between the emitter electrode 1 and the P type collector layer 6. An N type carrier concentration of the N⁻ type base layer 5 is, for example, about $1\times10^{13}$ (cm⁻³), but may be set to any desired carrier concentration depending on a breakdown voltage design of the semiconductor device 100.

The P type base layer 4 is a P type semiconductor layer, and is provided between the emitter electrode 1 and the N⁻ type base layer 5. A P type carrier concentration of the P type base layer 4 is about $1\times10^{17}$ (cm⁻³).

The P⁺ type contact layer 3 is provided between the emitter electrode 1 and the P type base layer 4. The P type carrier concentration of the P⁺ type contact layer 3 is about $1\times10^{19}$ (cm⁻³) to $1\times10^{20}$ (cm⁻³).

The N⁺ type emitter layer 2 is provided between the emitter electrode 1 and the P type base layer 4. The N⁺ type emitter layer 2 and the P⁺ type contact layer 3 are provided adjacent to each other in a direction parallel to an XY plane. In FIG. 2, the N⁺ type emitter layer 2 and the P⁺ type contact layer 3 are adjacent to each other along the X direction, and may be provided adjacent to each other along the Y direction. The N type carrier concentration of the N⁺ type emitter layer 2 is about $1\times10^{19}$ (cm⁻³) to $1\times10^{20}$ (cm⁻³).

First insulating films 18 are provided between the emitter electrode 1 and the N⁻ type base layer 5, and are in contact with both the emitter electrode 1 and the N⁻ type base layer 5. Each first insulating film 18 is in contact with the N⁺ type emitter layer 2, the P type base layer 4, and the N⁻ type base layer 5. The first insulating film 18 extends in the Z direction from a position in contact with the emitter electrode 1. The first insulating film 18 also extends in the Y direction. An insulating material, such as silicon oxide, may be used for the first insulating film 18. The first insulating films 18 are provided apart (spaced) from each other in the X direction. In FIG. 2, two first insulating films 18 are illustrated, but more first insulating films 18 are provided according to the number of first gate electrodes 8 in the semiconductor device 100.

The first gate electrode 8 controls on and off switching of the semiconductor device 100 according to a voltage applied thereto. As depicted in FIG. 1A, a plurality of first gate electrodes 8 extend in the Y direction. Each first gate electrode 8 is made of a semiconductor material to which a metal or an impurity is added. As depicted in FIG. 1A, the first gate electrodes 8 are connected in common by an electrode 28 extending in the X direction. Each first gate electrode 8 is insulated from the emitter electrode 1, the N⁺ type emitter layer 2, the P type base layer 4, and the N⁻ type base layer 5 by the first insulating film 18. That is, a first insulating film 18 is provided between each first gate electrode 8 and the emitter electrode 1, the N⁺ type emitter layer 2, the P type base layer 4, and the N⁻ type base layer 5. The first gate electrode 8 is provided between the N⁻ type base layer 5 and the emitter electrode 1. In FIG. 2, two first gate electrodes 8 are illustrated.

Second insulating films 19 are provided between the emitter electrode 1 and the N⁻ type base layer 5, and are in contact with both the emitter electrode 1 and the N⁻ type base layer 5. The second insulating film 19 is in contact with the P type base layer 4 and the N⁻ type base layer 5. The outermost second insulating films 19 contact the N⁺ type emitter layer 2 and the P⁺ type contact layer 3. The second insulating films 19 are spaced from the first insulating films 18 in the X direction. That is, as depicted in FIG. 1A, the N⁺ type emitter layer 2, the P⁺ type contact layer 3, the P type base layer 4, and a portion of the N⁻ type base layer 5 are provided between the first insulating films 18 and the outermost second insulating film 19 that are adjacent in the X direction to a first gate electrode 8.

The second insulating film 19 extends in the Z direction from a position in contact with the emitter electrode 1. The second insulating film 19 also extends in the Y direction. An insulating material such as silicon oxide may be used for the second insulating film 19. The second insulating films 19 are provided apart from each other in the X direction. That is, a portion of the $N^-$ type base layer 5 is provided between the second insulating films 19 that are adjacent to one another in the X direction. FIG. 2 shows an example in which four second insulating films 19 are provided between a pair of first insulating films 18, but the number of the second insulating films 19 is not particularly limited.

Each second gate electrode 9 controls discharge of holes in the semiconductor device 100 by adjustment of a voltage applied thereto. The second gate electrode 9 is made of a semiconductor material to which a metal or an impurity is added. A plurality of second gate electrodes 9 are provided between the $N^-$ type base layer 5 and the emitter electrode 1. As depicted in FIG. 1A, the second gate electrodes 9 are connected in common by an electrode 29 that extends in the X direction. A second gate electrode 9 that is adjacent to a first gate electrode 8 is insulated from the emitter electrode 1, the $P^+$ type contact layer 3, the P type base layer 4, and the $N^-$ type base layer 5 by the second insulating film 19. A second gate electrode 9 that is not adjacent to a first gate electrode 8 is insulated from the emitter electrode 1 and the $N^-$ type base layer 5 by the second insulating film 19.

FIG. 2 shows an example in which the shape of the first gate electrodes 8 and the shape of the second gate electrodes 9 are the same, but the present disclosure is not limited thereto, and the first gate electrodes 8 and the second gate electrodes 9 may be different shapes. For example, a length in the Y direction and a width in the X direction of the first gate electrodes 8 may be different from those of the second gate electrodes 9. In addition, the number of the first gate electrodes 8, the number of the second gate electrodes 9, are not limited to the numbers shown in the drawings.

A semiconductor portion (hereinafter referred to as a mesa portion) sandwiched between two adjacent insulating films (18 or 19) will be described.

A first mesa portion 21 is a semiconductor portion sandwiched between adjacent second insulating films 19. In the first embodiment, the first mesa portion will be denoted by reference numeral 21A. A second mesa portion 22 is a semiconductor portion sandwiched between a first insulating film 18 and a second insulating film 19. In the first embodiment, the second mesa portion will be denoted by reference numeral 22A. The first mesa portion and the second mesa portion will be denoted by reference numerals having different alphabets when configurations of semiconductor layers are different in the later-described embodiments and modifications.

As shown in FIGS. 1A and 2, a width in the X direction of the first mesa portion 21A between adjacent second insulating films 19 is defined as width W1. In other words, the distance between the adjacent second insulating films 19 is width W1. In addition, a length in the Z direction of the first mesa portion 21A is defined as a height L1. In other words, the length in the Z direction of the second insulating film 19 is equal to height L1. In the present embodiment, height L1 is greater than width W1. For example, as a measure by which the first mesa portion 21A can control the discharge of holes, $W1/L1 \leq 0.2$ is satisfied, and height L1 may have a value that is equal to or greater than five times of the value of width W1.

The portion of $N^-$ type base layer 5 located in the first mesa portion 21A is in electrical contact with the emitter electrode 1. The emitter electrode 1 contains a metal that exhibits Schottky characteristics with respect to an N type semiconductor material. Therefore, the $N^-$ type base layer 5 and the emitter electrode 1 are in Schottky contact. Accordingly, the breakdown voltage of the semiconductor device 100 when a reverse bias is applied can be increased.

Electrical connection relationships between the first gate electrodes 8 and the second gate electrodes 9 will be described. As shown in FIG. 2, in the semiconductor device 100 of the present embodiment, the first gate electrodes 8 are electrically connected to a first gate pad 58 through a wiring, such as electrode 28. Similarly, the second gate electrodes 9 are electrically connected to a second gate pad 59 through a wiring, such as electrode 29. A first gate voltage Vg1 (a first gate-emitter voltage) is applied to the first gate pad 58, and a second gate voltage Vg2 (a second gate-emitter voltage) is applied to the second gate pad 59. That is, the first gate electrodes 8 and the second gate electrodes 9 are configured such that different control voltages can be applied thereto respectively.

Figure 3:
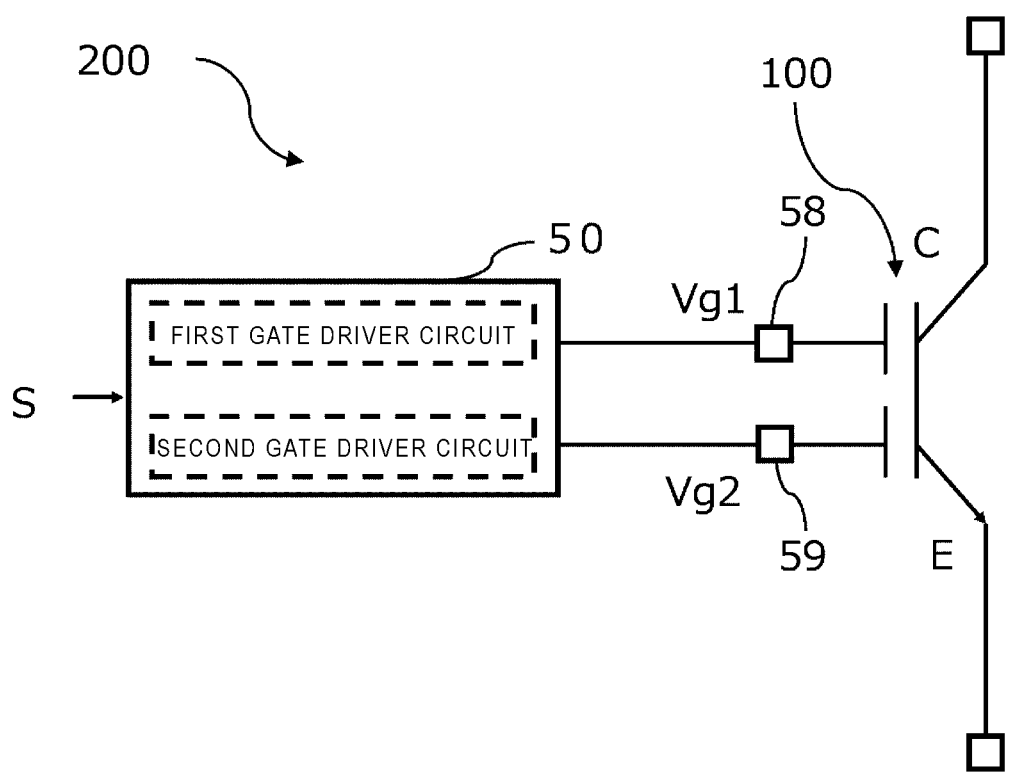
FIG. 3 is a schematic diagram showing a configuration of a semiconductor module according to the first embodiment.

Next, a configuration of a semiconductor module 200 will be described with reference to FIG. 3. FIG. 3 is a schematic diagram showing a gate driver circuit 50 as a component device of the semiconductor module 200 according to the first embodiment. The semiconductor module 200 includes the semiconductor device 100 and the gate driver circuit 50 that controls a voltage applied to the first gate pad 58 and a voltage applied to the second gate pad 59. The gate driver circuit 50 includes a first gate driver circuit and a second gate driver circuit. The gate driver circuit 50 can apply a voltage to the first gate pad 58 and the second gate pad 59 at different timings.

The first gate driver circuit applies the first gate voltage Vg1 to the first gate electrode 8 through the first gate pad 58 in accordance with an external control signal S having two values (Hs and Ls) or the like. The second gate driver circuit applies the second gate voltage Vg2 to the second gate electrode 9 through the second gate pad 59 also in accordance with a control signal S. In other examples, each gate driver circuit may be controlled by separate control signals rather than a single control signal S.

The first gate voltage Vg1 can be a high voltage (voltage Hg1) or a low voltage (voltage Lg1). The voltage Hg1 is equal to or greater than a threshold voltage Vth at which a channel is formed in the semiconductor device 100. When the voltage Hg1 is applied to the first gate electrode 8, the semiconductor device 100 is turned on, and a current flows from the collector electrode 7 to the emitter electrode 1. The voltage Lg1 is less than the threshold voltage Vth. Accordingly, when the voltage Lg1 is applied to the first gate electrode 8, the semiconductor device 100 is off.

The second gate voltage Vg2 can be a high voltage (voltage Hg2) or a low voltage (voltage Lg2). The voltage Lg2 is less than or equal to 0 V, for example.

Figure 5A:
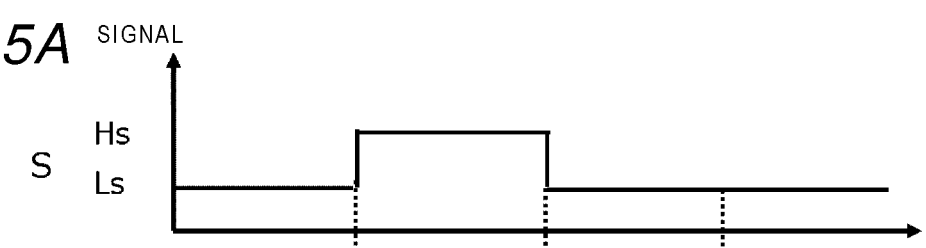
FIG. 5A is a timing chart showing values of the control signal of the semiconductor device with respect to each time point according to the first embodiment.
Figure 5B:
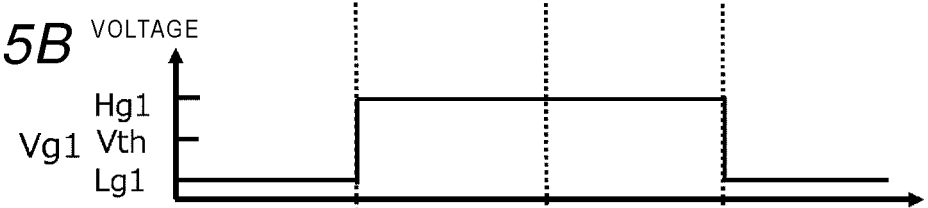
FIG. 5B is a timing chart showing values of the first gate voltage of the semiconductor device with respect to each time point according to the first embodiment.
Figure 5C:
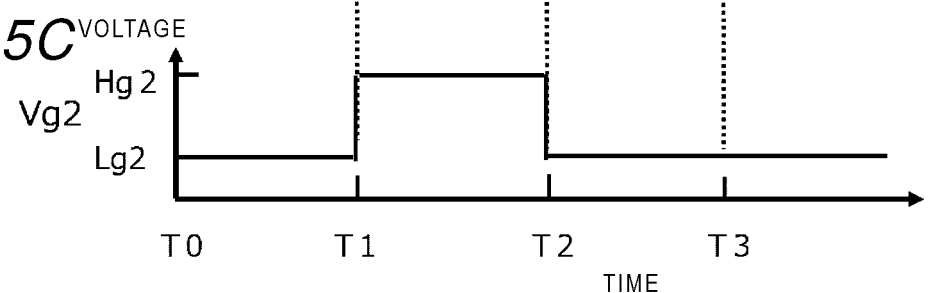
FIG. 5C is a timing chart showing values of the second gate voltage of the semiconductor device with respect to each time point according to the first embodiment.

Here, timing of the first gate voltage Vg1 and the second gate voltage Vg2 as controlled by the gate driver circuit 50 will be described. FIG. 4 is a table showing an operating state of the semiconductor device 100, and values of the control signal S, the first gate voltage Vg1, and the second gate voltage Vg2 at different time points T0, T1, T2, and T3. FIG. 5A is a timing chart showing values of the control signal S of the semiconductor device 100 with respect to each time point. FIG. 5B is a timing chart showing values of the first gate voltage Vg1 of the semiconductor device 100 with respect to each time point. FIG. 5C is a timing chart showing values of the second gate voltage Vg2 of the semiconductor device 100 with respect to each time point.

In the present example, the semiconductor device 100 is "turned on" with the switching of the control signal S from Ls to Hs, and the semiconductor device 100 is "turned off" with the switching of the control signal S from Hs to Ls.

However, this convention may be reversed in other examples, such that the switching of the control signal S and an on and off state of the semiconductor device 100 may be reversed from that of the present embodiment.

At time point T0, the semiconductor device 100 is in an off state. An Ls control signal S is being input to the gate driver circuit 50. The gate driver circuit 50 outputs the voltage Lg1 as the first gate voltage Vg1, and outputs the voltage Lg2 as the second gate voltage Vg2.

At time point T1, the semiconductor device 100 is switched from off to on (turned on). During a period from T1 to T2, the semiconductor device 100 is on. At time point T1, the control signal S input to the gate driver circuit 50 is switched to Hs, and the gate driver circuit 50 outputs the voltage Hg1 as the first gate voltage Vg1, and outputs the voltage Hg2 as the second gate voltage Vg2.

The time at which the switching of the first gate voltage Vg1 to the voltage Hg1 and of the time at which the switching of the second gate voltage Vg2 to the voltage Hg2 occurs are simultaneous in the description above, but the switching may be performed at different times offset from each other.

At time point T2, a first turn-off is performed on the semiconductor device 100. At the first turn-off, an amount of holes accumulated in the semiconductor device 100 is adjusted. At this time, the control signal S input to the gate driver circuit 50 switches from Hs to Ls, and the gate driver circuit 50 outputs the voltage Hg1 as the first gate voltage Vg1, and outputs the voltage Lg2 as the second gate voltage Vg2. After a predetermined time elapses from time point T2, the time point T3 is reached. The predetermined time in this context is the time required for adjusting the amount of accumulated holes, and is, for example, $5 \times 10^{-6}$ seconds. The semiconductor device 100 continues to be in the on state from the time point T2, at which the first turn-off is performed, to the time point T3.

At time point T3, a second turn-off is performed on the semiconductor device 100. At the second turn-off, a channel in a vicinity of an interface between the P type base layer and a side wall of the first insulating film 18 has substantially disappeared. At this time, the Ls control signal S is being input to the gate driver circuit 50, and the gate driver circuit 50 outputs the voltage Lg1 as the first gate voltage Vg1, and outputs the voltage Lg2 as the second gate voltage Vg2. The semiconductor device 100 is fully switched from on to off by the second turn-off.

After time point T3, the semiconductor device 100 is off. The Ls control signal S is input to the gate driver circuit 50, and the gate driver circuit 50 outputs the voltage Lg1 as the first gate voltage Vg1, and outputs the voltage Lg2 as the second gate voltage Vg2.

Figure 6:
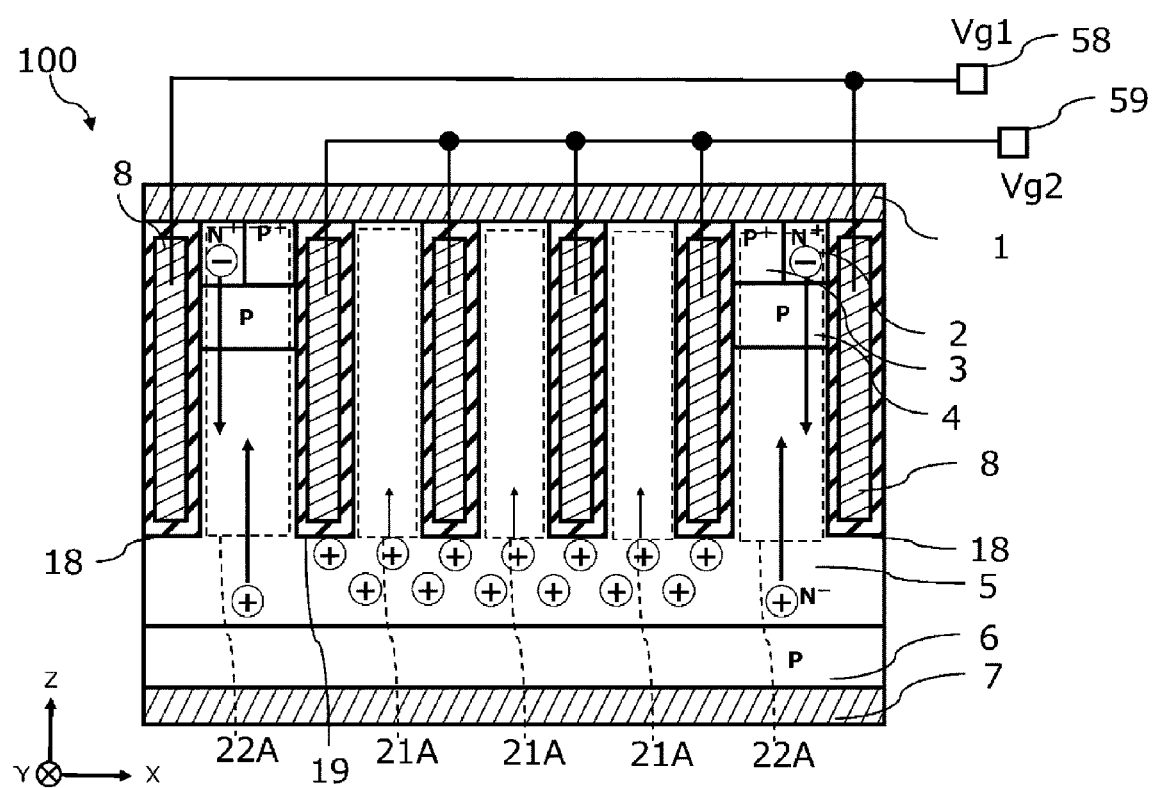
FIG. 6 is a diagram schematically showing a carrier behavior during an on operation of the semiconductor device according to the first embodiment.
Figure 7:
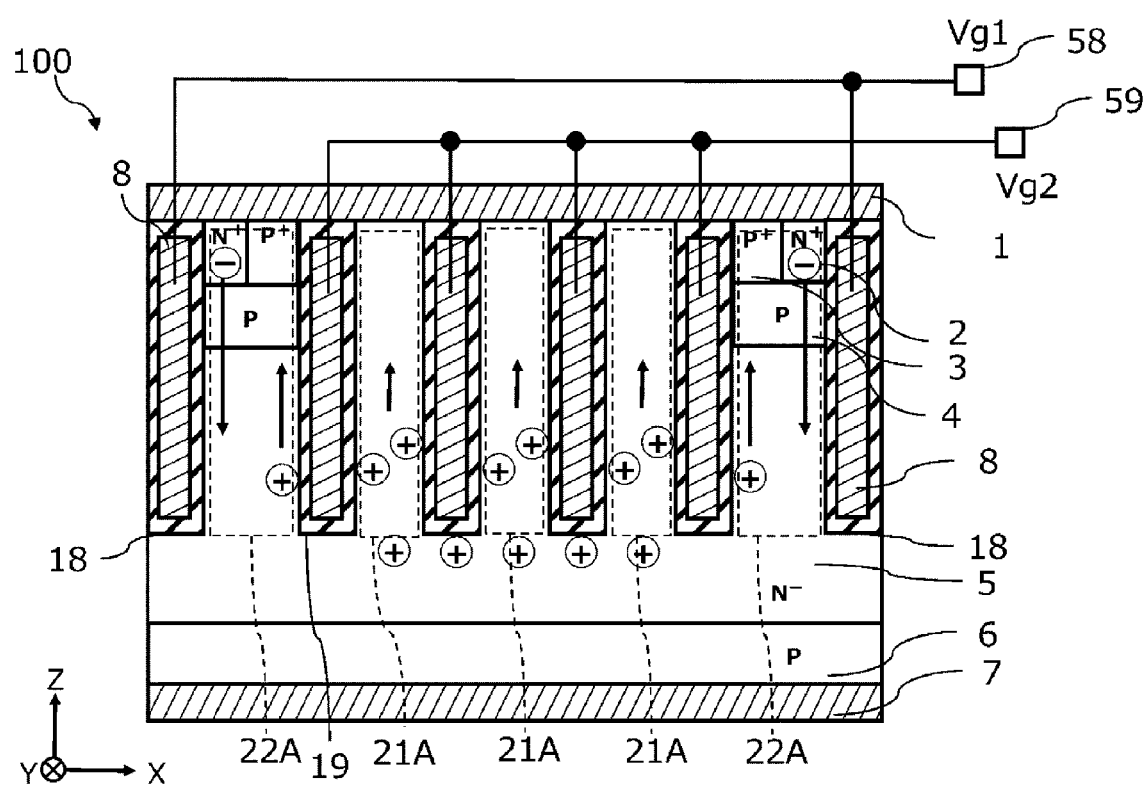
FIG. 7 is a diagram schematically showing a carrier behavior during a first turn-off operation of the semiconductor device according to the first embodiment.
Figure 8:
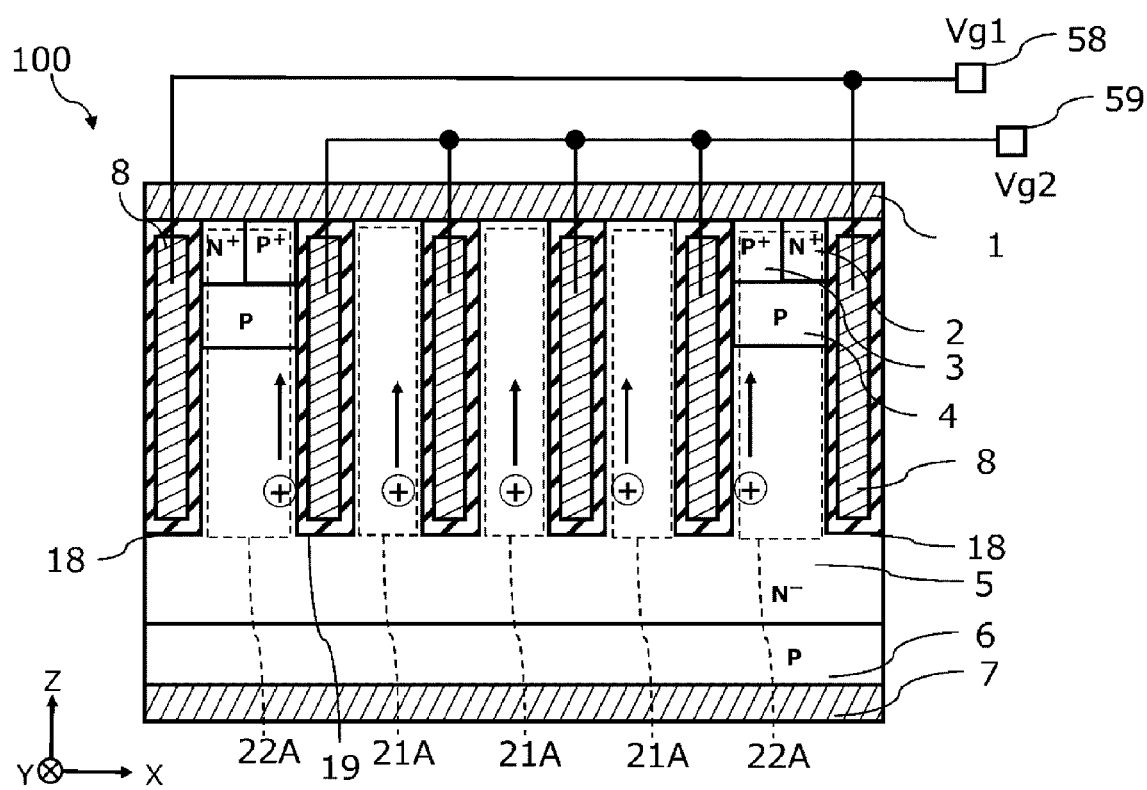
FIG. 8 is a diagram schematically showing a carrier behavior during a second turn-off operation of the semiconductor device according to the first embodiment.

With reference to FIGS. 6 to 8, a carrier behavior in each operation of the semiconductor device 100 according to the present embodiment will be described. A potential which is lower than that of the collector electrode 7 is applied to the emitter electrode 1.

FIG. 6 is a diagram schematically showing a carrier behavior during the on operation of the semiconductor device 100 at time point T1. By applying the voltage Hg1 to the first gate electrode 8, a channel is formed in the vicinity of the interface between the P type base layer 4 and the side wall of the first insulating film 18. The side wall is a surface extending in the Z direction of the first insulating film 18 and of the second insulating film 19.

As shown in FIG. 6, when the semiconductor device 100 is in the on state, electrons flow from the emitter electrode 1 towards the collector electrode 7 via, in this order, the $N^+$ type emitter layer 2, the P type base layer 4, the $N^-$ type base layer 5, and the P type collector layer 6, to reach the collector electrode 7. The holes are injected from the P type collector layer 6 into the $N^-$ type base layer 5. The holes injected into the $N^-$ type base layer 5 flow through the P type base layer 4 and from the $P^+$ type contact layer 3 to the emitter electrode 1, or flow directly to the emitter electrode 1 through the $N^-$ type base layer 5.

In the first embodiment, the width W1 is smaller than the height L1 of the first mesa portion 21A. The first mesa portion 21A has an elongated shape, through which it is difficult for the holes to flow. In addition, since the width of the first mesa portion 21A is narrow, carrier behavior in the first mesa portion 21A is greatly affected by electric fields generated by the second gate electrodes 9 even in a central portion of the first mesa portion 21A which is farthest from the second gate electrodes 9. For example, in a semiconductor device 100 that satisfies $W1/L1 \leq 0.2$, when the voltage Hg2 is applied to the second gate electrodes 9, the discharge of holes from the first mesa portion 21A to the emitter electrode 1 is reduced.

In the first embodiment, a P type semiconductor is not provided in the first mesa portion 21A. That is, the $P^+$ type contact layer 3 and the P type base layer 4 are not provided in the first mesa portion 21A. For this reason, the discharge of the holes from the first mesa portion 21A is further reduced.

Since the discharge of holes is reduced, holes are accumulated in the $N^-$ type base layer 5. Resistance of the $N^-$ type base layer 5 is reduced by conductivity modulation due to the accumulation of holes, and thus the on-voltage of the semiconductor device 100 is reduced.

FIG. 7 is a diagram schematically showing a carrier behavior during the first turn-off of the semiconductor device 100 according to the first embodiment at time point T2. The gate driver circuit 50 applies the voltage Lg2 to the second gate electrodes 9 while applying the voltage Hg1 to the first gate electrodes 8.

The voltage Lg2 is applied to the second gate electrodes 9, so that the holes in the $N^-$ type base layer 5 accumulate in a portion along the side walls of the second insulating films 19. The accumulated holes are discharged to the emitter electrode 1 along the side walls of the second insulating films 19. At this time, holes are discharged from the first mesa portions 21A. In the first embodiment, since a plurality of the second insulating films 19 are provided between adjacent first insulating films 18, there are multiple hole discharging paths, and a high discharging effect is obtained.

Since the voltage Hg1 is applied to the first gate electrodes 8, a channel is formed in the vicinity of the interface between the P type base layer 4 and the side wall of the first insulating film 18. When a carrier density of the $N^-$ type base layer 5 is reduced and a collector-emitter voltage increases, a current flows through the channel between collector-emitter. That is, during the partial on state operation from time point T2 to time point T3, steady loss increases as compared with the full on state operation from time point T1 to time point T2.

FIG. 8 is a diagram schematically showing a carrier behavior during the second turn-off operation of the semiconductor device 100 according to the first embodiment at time point T3. The gate driver circuit 50 applies the voltage Lg1 to the first gate electrodes 8 while applying the voltage Lg2 to the second gate electrodes 9.

By applying the voltage Lg1 to the first gate electrodes 8, the channel formed in the vicinity of the P type base layer and the first insulating film 18 disappears, and the semiconductor device 100 is switched to the off state. At that time, holes accumulated in the N⁻ type base layer 5 are discharged from the first mesa portions 21A and the second mesa portions 22A to the emitter electrode 1. As the semiconductor device 100 switches to the off state, the collector-emitter voltage increases. Therefore, a switching loss due to the second turn-off occurs.

However, a part of the holes are discharged at the time of the first turn-off, and the number of accumulated holes is reduced. For this reason, the semiconductor device 100 quickly shifts to the off state at time point T3, and an amount of charge flowing at the time of the second turn-off also decreases. Accordingly, the switching loss at the time of the second turn-off of the semiconductor device 100 is small. Further, a sum of an energy loss obtained by combining the steady loss increased by the partial on operation from time point T2 to time point T3, and the switching loss at the time of the second turn-off is also reduced.

During the off operation of the semiconductor device 100, the voltage Lg2 is applied to the second gate electrodes 9. Although not shown, a depletion layer is formed in the first mesa portion 21A, and a breakdown voltage at the time of off is improved. At this time, a value twice as large as a maximum width of the depletion layer formed from the side wall of the second insulating film 19 is larger than the value of width W1.

According to the first embodiment, the semiconductor device 100 includes the plurality of second insulating films 19 between the adjacent first insulating films 18. The first gate electrodes 8 are provided in the first insulating films 18, and the second gate electrodes 9 are provided in the second insulating films 19. The width W1 of the first mesa portion 21A is less than the height L1 of the first mesa portion 21A. The discharge of holes from the first mesa portion 21A is controlled by the voltage on the second gate electrodes 9.

During the on operation from T1 to T2, since holes are not easily discharged from the first mesa portion 21A, the on-voltage is lowered by conductivity modulation. At the first turn-off at T2, the voltage of the second gate electrode 9 is lowered, so that a part of the holes can be discharged from the first mesa portion 21A in advance. At the second turn-off at T3, when the voltage of the first gate electrode 8 is lowered, the channel formed at the P type base layer 4 disappears. Since the semiconductor device 100 (and thus the semiconductor module 200 incorporating the semiconductor device 100) already discharges a part of the holes at the first turn-off, it is possible to reduce the switching loss when the channel disappears. Furthermore, it is possible to reduce the sum of the energy loss obtained by combining the steady loss increased due to the first turn-off (on operation from time point T2 to time point T3) and the switching loss at the time of the second turn-off in the semiconductor device 100.

Figure 9:
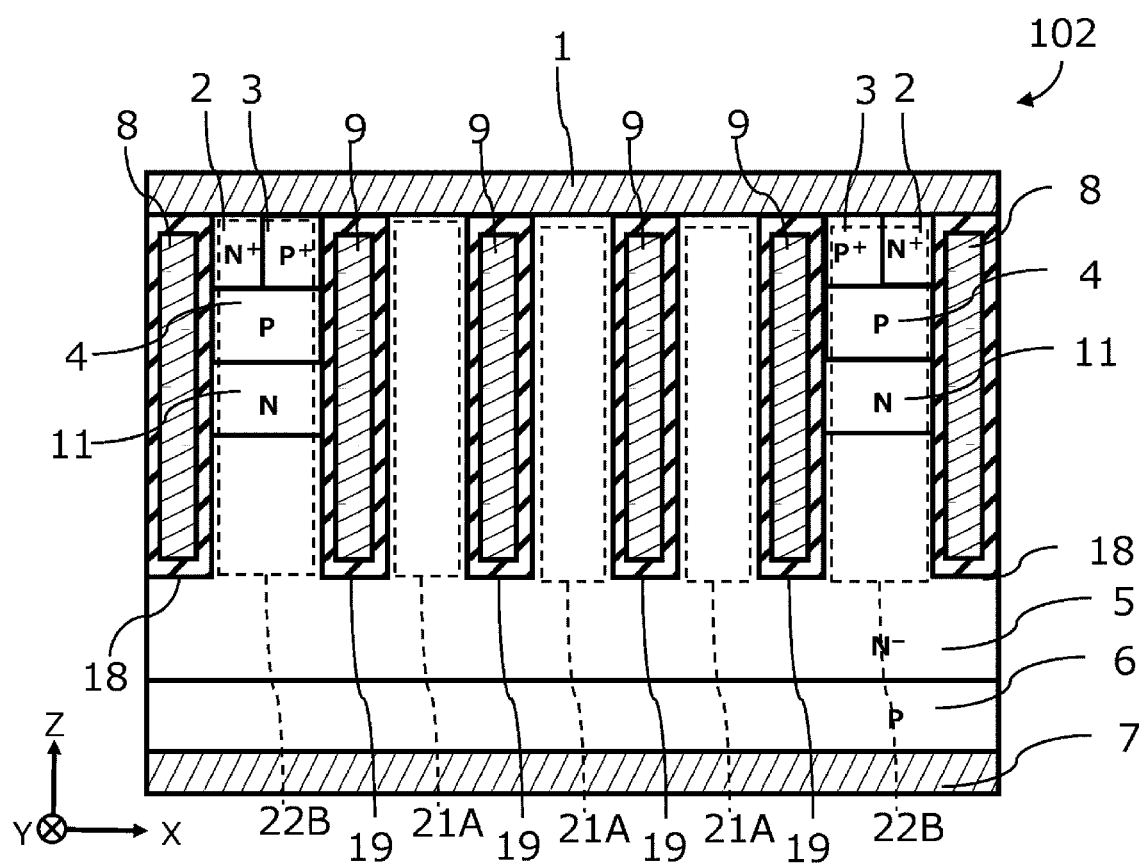
FIG. 9 is a schematic cross-sectional view showing a configuration of a semiconductor device according to a first modification of the first embodiment.

Here, a first modification of the first embodiment will be described. FIG. 9 is a schematic cross-sectional view showing a configuration of a semiconductor device 102 according to a first modification of the first embodiment. In FIG. 9 and subsequent drawings, for convenience of description, the first gate pad 58, the second gate pad 59, and the wiring connecting each gate pad and each gate electrode are omitted.

As shown in FIG. 9, in addition to the configuration of the semiconductor device 100, the semiconductor device 102 is provided with an N type barrier layer 11 between the P type base layer 4 and the N⁻ type base layer 5.

The N type barrier layer 11 is provided in the semiconductor device 102, so that it is more difficult for holes to escape from the N⁻ type base layer 5 of a second mesa portion 22B to the P type base layer 4. Since the holes are less likely to be discharged from the N⁻ type base layer 5 to the P type base layer 4, accumulation of the holes in the N⁻ type base layer 5 is promoted. Since the conductivity modulation occurs due to accumulation of the holes, the semiconductor device 102 shown in FIG. 9 can obtain a lower on-voltage than the semiconductor device 100 shown in FIG. 2.

Figure 10:
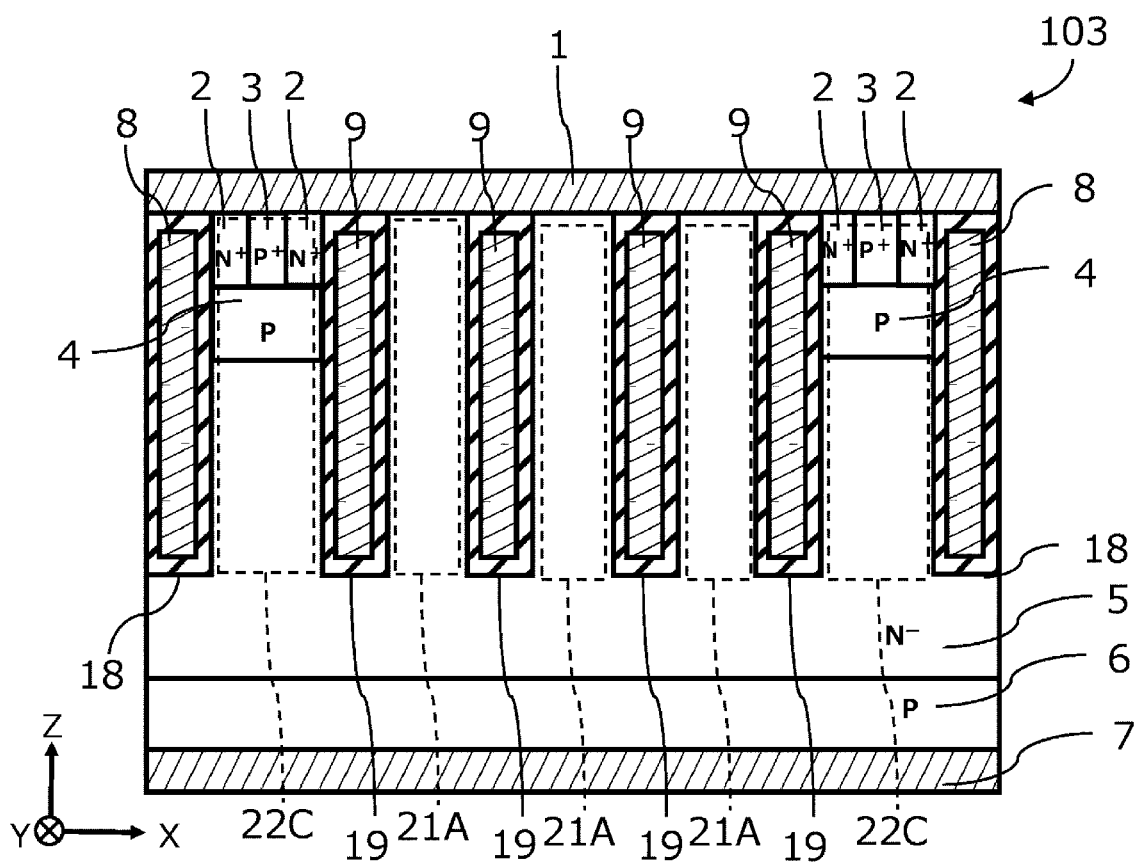
FIG. 10 is a schematic cross-sectional view showing a configuration of a semiconductor device according to a second modification of the first embodiment.
Figure 11:
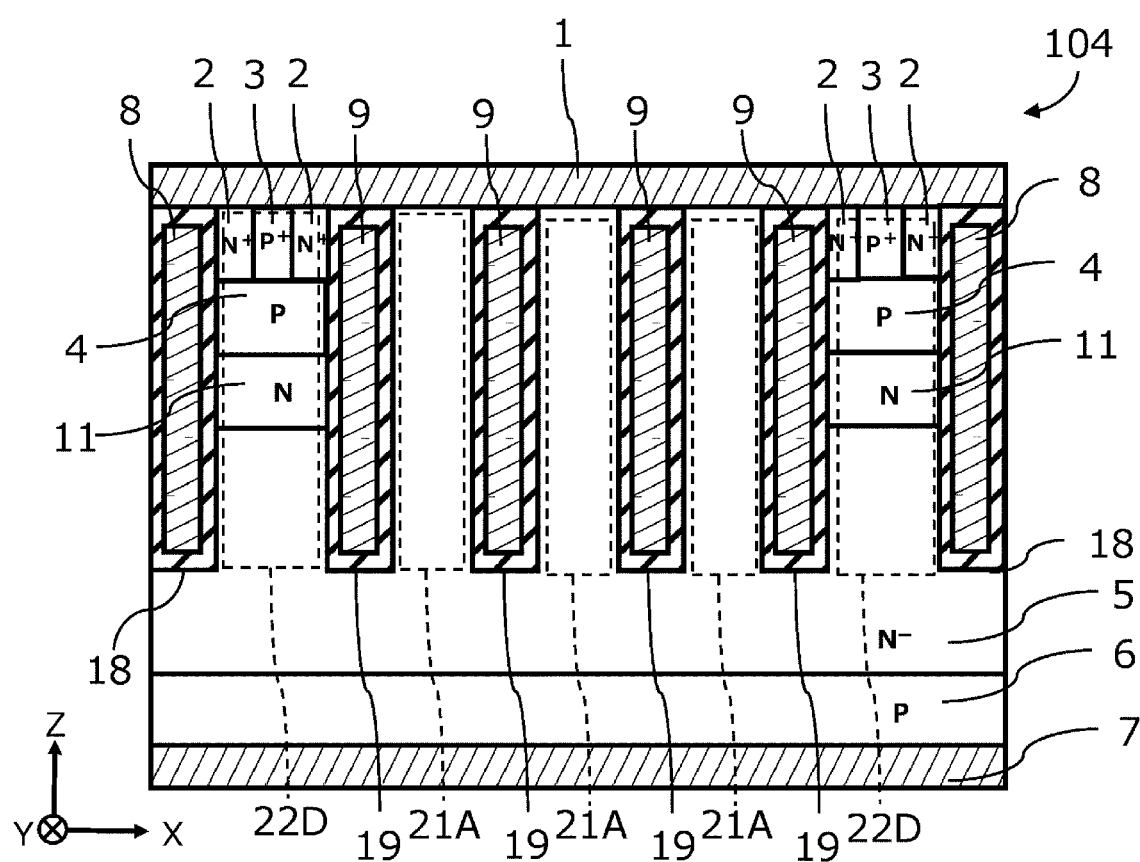
FIG. 11 is a schematic cross-sectional view showing a configuration of a semiconductor device according to a third modification of the first embodiment.

FIG. 10 is a schematic cross-sectional view showing a configuration of a semiconductor device 103 according to a second modification of the first embodiment. FIG. 11 is a schematic cross-sectional view showing a configuration of a semiconductor device 104 according to a third modification of the first embodiment. According to the second modification shown in FIG. 10 and the third modification shown in FIG. 11, in addition to the configuration of the semiconductor device 100 another N⁺ type emitter layer 2 is included, this additional N⁺ type emitter layer 2 is provided to be in contact with the second insulating film 19. The semiconductor device 104 (the third modification) is different from the semiconductor device 103 (the second modification) in that the N type barrier layer 11 is also provided in manner similar to the first modification (semiconductor device 102).

In the semiconductor device 103 shown in FIG. 10 and the semiconductor device 104 shown in FIG. 11, the P⁺ type contact layer 3 is located between the two N⁺ type emitter layers 2 in the second mesa portions 22C and 22D. In semiconductor device 100, during the on state, a channel also forms in the P type base layer 4 along the side wall of the second insulating film 19.

The semiconductor device 103 and the semiconductor device 104 can operate with a lower on-voltage because the number of channels during the on operation is larger than that of the semiconductor device 100. Further, by turning off the channel formed along the side wall of the second insulating film 19 at the time of the first turn-off at T2, the channel and the amount of charge that are turned off at the time of the second turn-off are reduced, so that the switching loss can be reduced. The N⁺ type emitter layers 2 in contact with the first insulating film 18 and the second insulating film 19 may be formed in stripes in the Y direction or formed alternately with the P⁺ type contact layers 3 in the Y direction. That is, the P⁺ type contact layer 3 is not necessarily located between the N⁺ type emitter layers 2 in the X direction for all possible cross sections taken at points along the Y-direction (that is, some cross-sections would appear as in FIG. 2 rather than FIG. 9, or FIG. 8 rather than FIG. 10, depending at which point along the Y direction the cross-section was taken).

Second Embodiment

Figure 12:
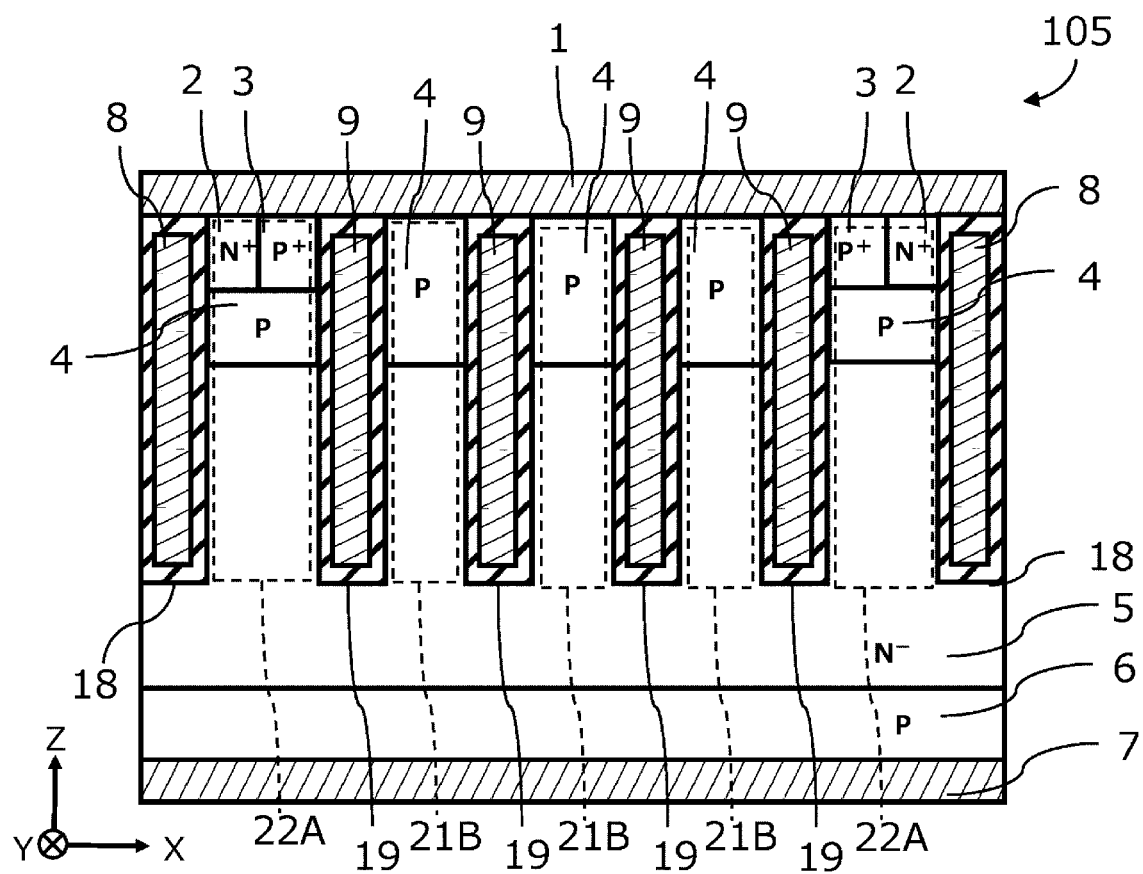
FIG. 12 is a schematic cross-sectional view showing a configuration of a semiconductor device according to a second embodiment.

A semiconductor device 105 according to a second embodiment will be described with reference to FIG. 12. FIG. 12 is a schematic cross-sectional view showing a configuration of the semiconductor device 105 according to the second embodiment. The semiconductor device 105 according to the second embodiment is different from the first embodiment in that the P type base layer 4 is also provided in the first mesa portions.

The configuration of the second mesa portion is substantially similar to the configuration of the second mesa portion 22A of the semiconductor device 100 of the first embodiment.

A first mesa portion 21B includes the P type base layer 4 and the N⁻ type base layer 5. The P type base layer 4 is between the emitter electrode 1 and the N⁻ type base layer 5 in the first mesa portion 21B.

The P type base layer 4 is provided in the first mesa portion 21B so that discharging holes from the first mesa portion 21B to the emitter electrode 1 is improved when the second gate voltage Vg2 is set to the voltage Lg2. Therefore, in the second embodiment, the time required for the first turn-off is shortened and the steady loss of the first turn-off is reduced.

Furthermore, the P type base layer 4 and the N⁻ type base layer 5 form a PN junction, so that the voltage applied to the first mesa portion 21B is reverse biased. Accordingly, the breakdown voltage when the semiconductor device 105 is turned off is improved.

Additionally, since the emitter electrode 1 of the second embodiment does not directly contact the N type semiconductor layer in the first mesa portion 21B, the emitter electrode 1 does not necessarily have to be made of a material containing a metal that exhibits Schottky characteristics with respect to the N type semiconductor.

Although the structure of the semiconductor layer of the second mesa portion 22A in the semiconductor device 105 is illustrated and described as being similar to that of the first embodiment (FIG. 2), the structure of any one of the second mesa portions 22B, 22C, or 22D may instead be adopted similar to the modifications described with respect to the first embodiment.

As described above, according to the second embodiment, the semiconductor device 105 having a reduced steady loss of the first turn-off and higher breakdown voltage can be obtained.

Third Embodiment

Figure 13:
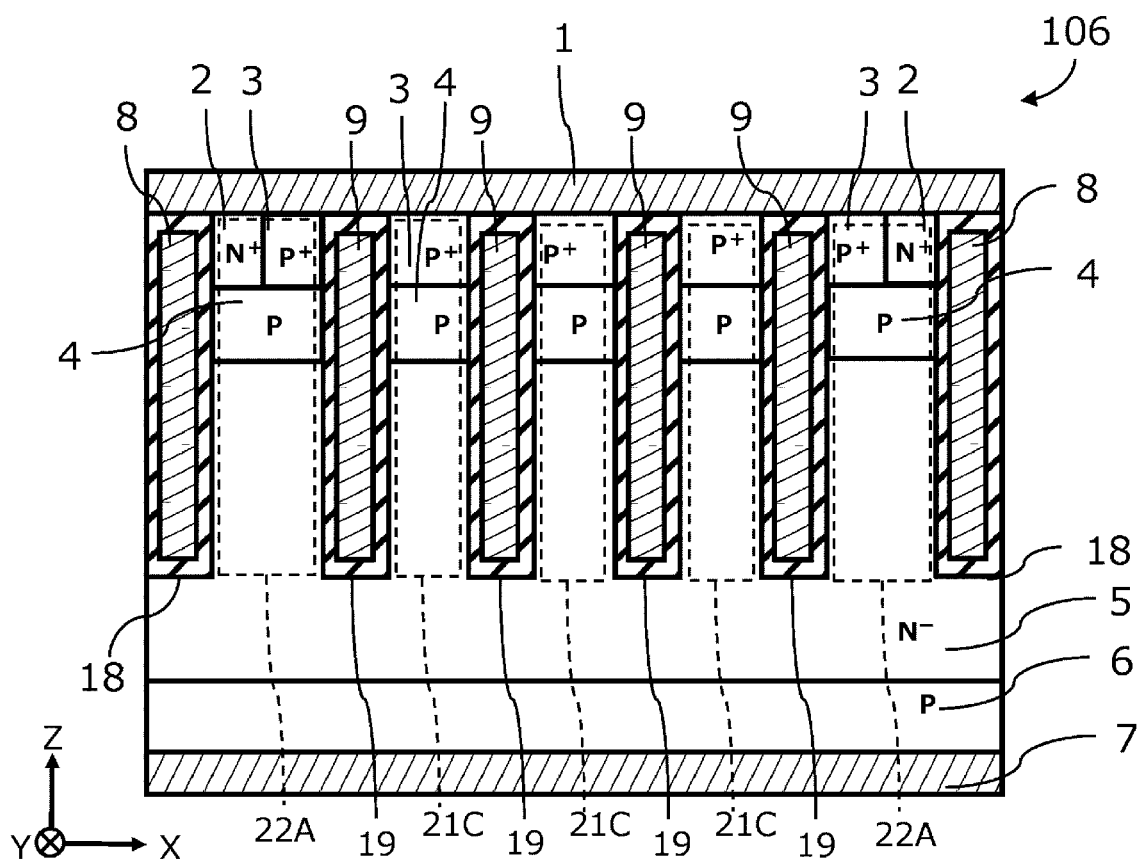
FIG. 13 is a schematic cross-sectional view showing a configuration of a semiconductor device according to a third embodiment.

A semiconductor device 106 according to a third embodiment will be described with reference to FIG. 13. FIG. 13 is a schematic cross-sectional view showing a configuration of the semiconductor device 106 according to the third embodiment. As shown in FIG. 13, the semiconductor device 106 is different from the first embodiment in that the P type base layer 4 and the P⁺ type contact layer 3 are also provided in the first mesa portion.

The configuration of the second mesa portion is similar to the configuration of the second mesa portion 22A of the semiconductor device 100.

A first mesa portion 21C is provided with the P⁺ type contact layer 3, the P type base layer 4, and the N⁻ type base layer 5. The P type base layer 4 is between the N⁻ type base layer 5 and the emitter electrode 1. The P⁺ type contact layer 3 is between the P type base layer 4 and the emitter electrode 1.

The P type semiconductor layers are provided in the first mesa portion 21C, so that the effect of discharging holes to the emitter electrode 1 is improved when the second gate voltage Vg2 is set to the voltage Lg2.

Further, the P type base layer 4 and the N⁻ type base layer 5 form the PN junction, so that the voltage applied to the first mesa portion 21C is reverse biased. Accordingly, the breakdown voltage when the semiconductor device 106 is turned off is improved.

The emitter electrode 1 according to the third embodiment need not be made of a material containing a metal that exhibits Schottky characteristics with respect to the N type semiconductor since the emitter electrode 1 does not directly contact the N⁻ type base layer 5.

Although the second mesa portion 22A in the semiconductor device 106 is illustrated and described as being similar to that of the first embodiment (FIG. 2), any one of the second mesa portions 22B, 22C, or 22D may instead be adopted.

As described above, a semiconductor device 106 having a reduced steady loss of the first turn-off and higher breakdown voltage can be obtained.

Fourth Embodiment

Figure 14:
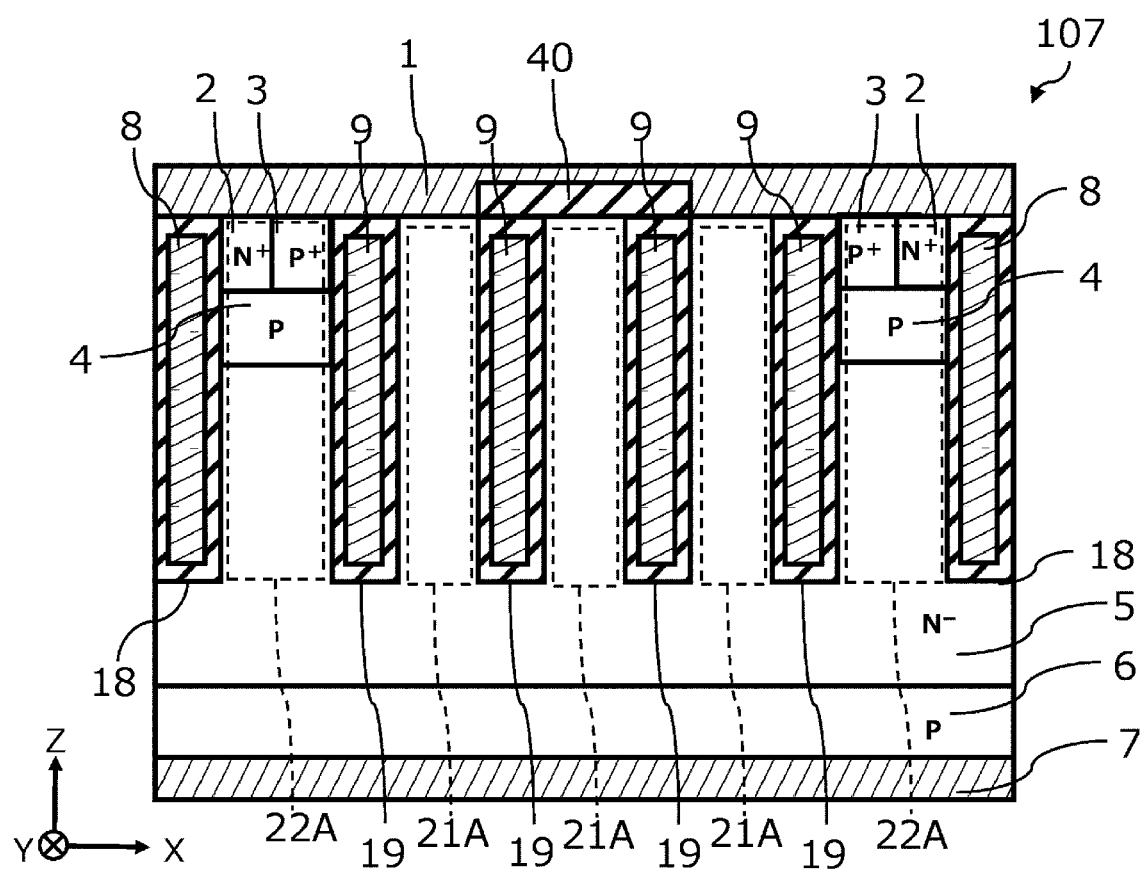
FIG. 14 is a schematic cross-sectional view showing a configuration of a semiconductor device according to a fourth embodiment.

A semiconductor device 107 according to a fourth embodiment will be described with reference to FIG. 14. FIG. 14 is a schematic cross-sectional view showing a configuration of the semiconductor device 107 according to the fourth embodiment. As shown in FIG. 14, the semiconductor device 107 according to the fourth embodiment is different from the first embodiment in that a mesa portion insulating film 40 is provided immediately above at least one of the first mesa portions 21A.

The mesa portion insulating film 40 is provided immediately above a first mesa portion 21A in the Z direction, and is thus in contact with the semiconductor layer (N⁻ type base layer 5) constituting the first mesa portion 21A. The mesa portion insulating film 40 is provided between at least one of the first mesa portions 21A and the emitter electrode 1.

In the semiconductor device 107, by providing the mesa portion insulating film 40, the amount of carrier (holes) conducted through the insulated first mesa portion 21A is reduced, and a carrier accumulation amount in the N⁻ type base layer 5 can be controlled. Accordingly, the semiconductor device 107 can adjust the on-voltage and a switching speed.

Although the structure of each semiconductor layer in the semiconductor device 107 of the fourth embodiment is illustrated and described on an assumption that the structure of the semiconductor layers of the first mesa portion and the second mesa portion is similar to those of the first embodiment (FIG. 2), the structure of any one of the first mesa portions 21B or 21C and the second mesa portions 22B, 22C, or 22D may instead be adopted.

As described above, according to the fourth embodiment, a semiconductor device 107 capable of adjusting the on-voltage can be obtained.

Fifth Embodiment

Figure 15:
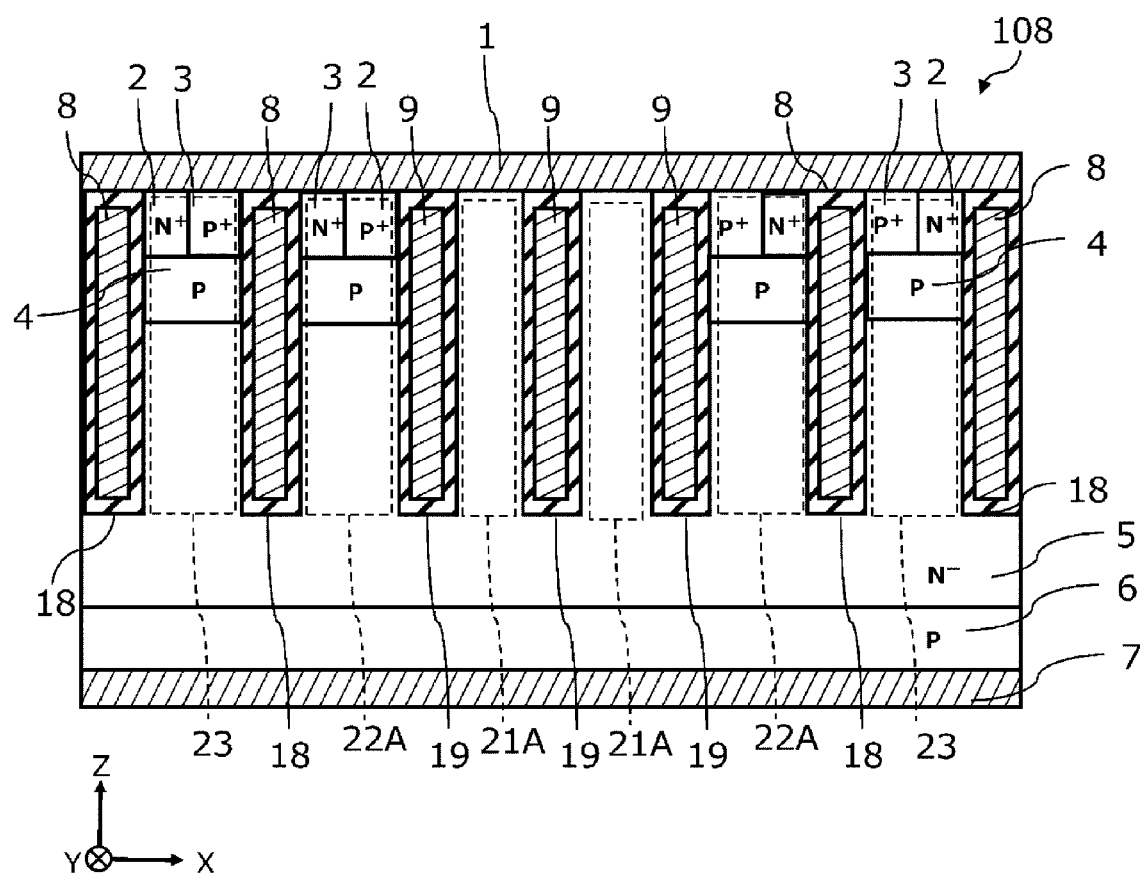
FIG. 15 is a schematic cross-sectional view showing a configuration of a semiconductor device according to a fifth embodiment.

A semiconductor device 108 according to a fifth embodiment will be described with reference to FIG. 15. FIG. 15 is a schematic cross-sectional view showing a configuration of the semiconductor device 108 according to the fifth embodiment. As shown in FIG. 15, the semiconductor device 108 according to the fifth embodiment is different from the first embodiment in that the semiconductor device 108 includes a third mesa portion 23 sandwiched between two first gate electrodes 8 directly adjacent in the X direction with not second gate electrodes 9 disposed therebetween.

The semiconductor device 108 has a structure in which two or more first gate electrodes 8 are arranged adjacently to each other without a second gate electrode 9 therebetween. There are also regions in which second gate electrodes 9 are between first gate electrodes 8.

The third mesa portion 23 is provided between a pair of adjacent first insulating films 18. The third mesa portion 23 includes the N⁺ type emitter layer 2, the P⁺ type contact layer 3, the P type base layer 4, and the N⁻ type base layer 5, and may have a semiconductor layer configuration similar to that of the second mesa portion 22A, for example.

Similarly to the second mesa portion 22A, the third mesa portion 23 forms a channel when the semiconductor device 108 is turned on. In the third mesa portion 23, a channel is formed even during the first turn-off. In the semiconductor device 108, the third mesa portion 23 is provided, so that a channel density can be provided.

The semiconductor device 108 can control the channel density and the carrier accumulation amount of the $N^-$ type base layer 5 by increasing the carrier conductive amount through the third mesa portion 23. Accordingly, the semiconductor device 108 can adjust the on-voltage according to the design requirement.

Although the structures of the semiconductor layers of the first mesa portion 21A and the second mesa portion 22A in the semiconductor device 108 of the fifth embodiment are illustrated and described as being similar to those of the first embodiment (FIG. 2), the structure of any one of the first mesa portions 21B or 21C and the second mesa portions 22B, 22C, or 22D may instead be adopted. Similarly to the fourth embodiment, in the semiconductor device 108, a mesa portion insulating film 40 may be further provided immediately above at least one of the first mesa portion 21A.

As described above, according to the fifth embodiment, the semiconductor device 108 capable of adjusting the on-voltage can be obtained.

Sixth Embodiment

Figure 16:
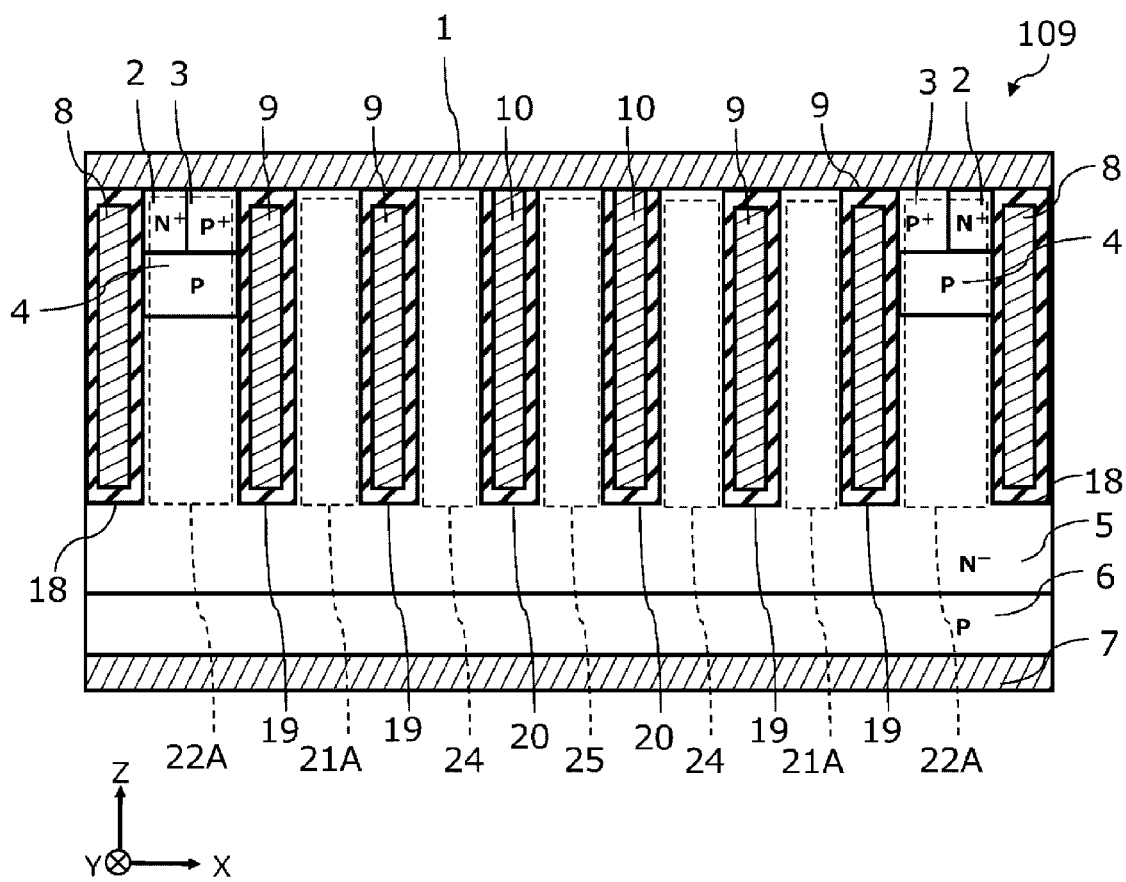
FIG. 16 is a schematic cross-sectional view showing a configuration of a semiconductor device according to a sixth embodiment.

A semiconductor device 109 according to a sixth embodiment will be described with reference to FIG. 16. FIG. 16 is a schematic cross-sectional view showing a configuration of the semiconductor device 109 according to the sixth embodiment. As shown in FIG. 16, the semiconductor device 109 according to the sixth embodiment is different from the first embodiment in that the semiconductor device 109 includes a third insulating film 20 and a third gate electrode 10 (dummy gate electrode) formed in the third insulating film 20.

The semiconductor device 109 is provided with one or more third insulating films 20. The third insulating film 20 is provided between the emitter electrode 1 and the $N^-$ type base layer 5 and is in contact with both the emitter electrode 1 and the $N^-$ type base layer 5. The third insulating film 20 extends in the Z direction from a position in contact with the emitter electrode 1. The third insulating film 20 extends in the Y direction. An insulating material such as silicon oxide may be used for the third insulating film 20.

The third insulating film 20, the first insulating film 18, the second insulating film 19, and the other third insulating film 20 are provided apart from each other in the X direction. In FIG. 16, the third insulating films 20 are provided between second insulating films 19. At least one first mesa portion 21A is also formed in the semiconductor device 109 between separated pairs of first gate electrodes 8.

A fourth mesa portion 24 is sandwiched between a second insulating film 19 and a third insulating film 20 that are adjacent to each other. A fifth mesa portion 25 is sandwiched between an adjacent pair of third insulating films 20. FIG. 16 shows an example in which the fourth mesa portion 24 and the fifth mesa portion 25 are similar to the first mesa portion 21A in structure, height, and width. However, the configuration of the fourth mesa portion 24 and the fifth mesa portion 25 is not limited to be the same as the first mesa portion 21A, and may instead be similar to the first mesa portions 21B and 21C. The fourth mesa portion 24 and the fifth mesa portion 25 may have different structures from each other.

The third gate electrode 10 extends in the Y direction, and is formed in the third insulating film 20. The third gate electrode 10 is made of a semiconductor material to which a metal or an impurity is added. The third gate electrode 10 is insulated from the fourth mesa portion 24 and the fifth mesa portion 25 by the third insulating film 20.

The third gate electrode 10 is in electrical contact with the emitter electrode 1, and functions as a dummy electrode whose potential is not controlled independently. The third gate electrode 10 is maintained at a potential level the same as that of the emitter electrode 1, and does not form a channel in the fourth mesa portion 24 and the fifth mesa portion 25. Therefore, as compared with the semiconductor device 100 of the first embodiment, in the semiconductor device 109, the channel density is reduced, and the time taken for the disappearance of the channel in the second turn-off is further shortened, so that the semiconductor device 109 is quickly turned off. That is, the switching speed of the semiconductor device 109 is improved.

The carrier amount conductive through the fourth mesa portion 24 and the fifth mesa portion 25 during on, the first turn-off, and the second turn-off of the semiconductor device 109 can be adjusted by the number and positions of the third gate electrodes 10.

Figure 17:
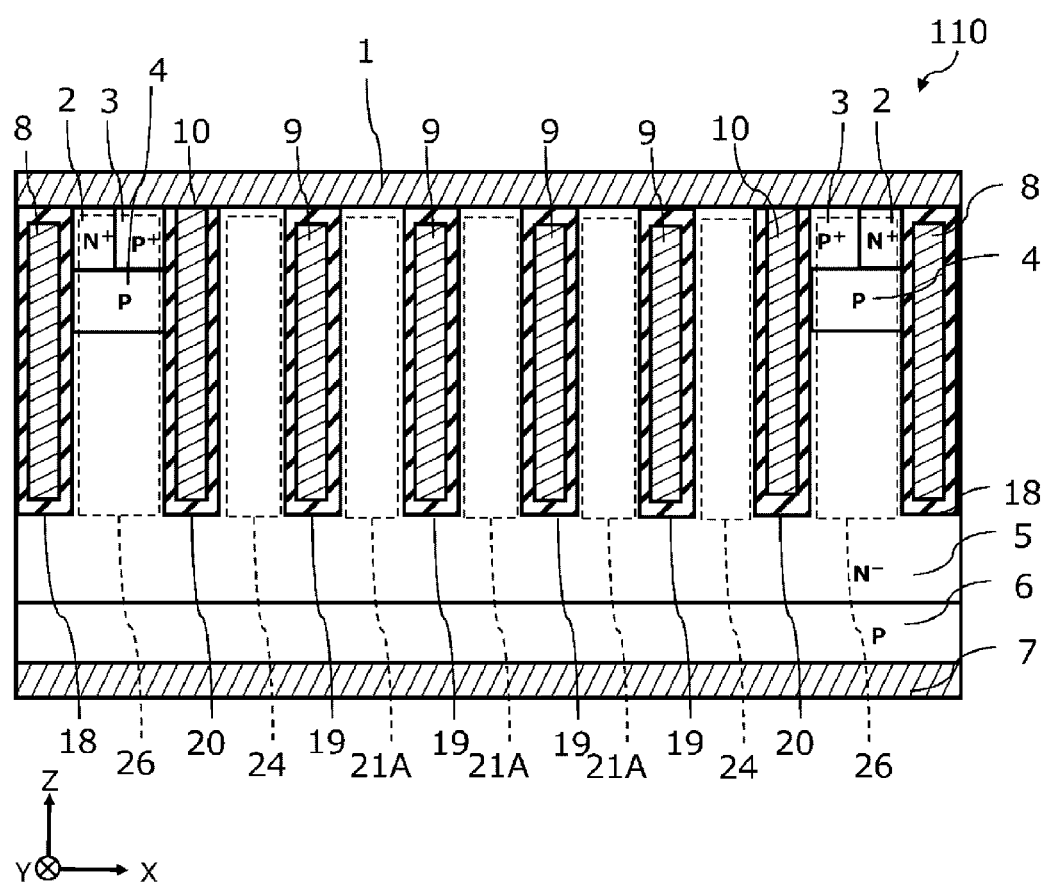
FIG. 17 is a schematic cross-sectional view showing a configuration of a semiconductor device according to a modification of the sixth embodiment.

As shown in FIG. 17, the third insulating film 20 may be provided between the first insulating film 18 and the second insulating film 19. FIG. 17 is a schematic cross-sectional view showing a configuration of a semiconductor device 110 according to a modification of the sixth embodiment. As shown in FIG. 17, the semiconductor device 110 includes at least one third gate electrode 10 formed in the third insulating film 20 between a first gate electrode 8 and a second gate electrode 9 that would otherwise be adjacent to each other in the X-direction.

A sixth mesa portion 26 is sandwiched between the first insulating film 18 and the third insulating film 20 that are adjacent to each other. The sixth mesa portion 26 may have the same structure as that of a second mesa portion 22A, for example. Similar to the semiconductor device 109, the semiconductor device 110 according to the modification of the sixth embodiment has a reduced channel density and an improved switching speed.

Although the structures of first mesa portions and second mesa portions in the semiconductor device 109 and the semiconductor device 110 are illustrated and described as being similar to those of the first embodiment (FIG. 2), the structure of any one of the first mesa portions 21A, 21B, and 21C and the second mesa portions 22A, 22B, 22C, and 22D may instead be adopted. In the semiconductor device 109 and the semiconductor device 110, the mesa portion insulating film 40 may be further provided immediately above a first mesa portion 21A similarly to the fourth embodiment, and also immediately above a fifth mesa portion 25.

As described above, according to the sixth embodiment and the modification of the sixth embodiment, the semiconductor devices 109 and 110 with improved switching speed can be obtained.

The semiconductor device used in the semiconductor module 200 is not limited to the semiconductor device 100, and any one of the described semiconductor devices 100 to 110 may be used.

During the on operation, holes are not easily discharged from the first mesa portion (s), conductivity modulation occurs, and the on-voltage is lowered. When switching from on to off, the voltage of the second gate electrodes 9 is lowered before the voltage of the first gate electrodes 8 is lowered, so that a part of the holes are first discharged from the first mesa portion(s), and the switching loss is reduced. Further, a semiconductor device and a semiconductor module reduce total energy loss.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
    a first electrode spaced from a second electrode in a first direction;
    a first semiconductor layer of a first conductivity type between the first and second electrodes;
    a first pair of first gate electrodes between the first and second electrodes and spaced from each other in a second direction intersecting the first direction, each first gate electrode extending in the first direction into the first semiconductor layer and surrounded by a first gate insulating film;
    a plurality of second gate electrodes between the first pair of first gate electrodes in the second direction and spaced from each other in the second direction, each second gate electrode extending in the first direction between the first and second electrodes and surrounded by a second gate insulating film;
    a second semiconductor layer of a second conductivity type on the first semiconductor layer in a first region between a first gate electrode of the first pair and one of the plurality of second gate electrodes;
    a third semiconductor layer of the first conductivity type on the second semiconductor layer, the third semiconductor layer being directly adjacent to the first gate insulating film; and
    a fourth semiconductor layer of the second conductivity type on the second semiconductor layer adjacent to the third semiconductor layer in the second direction, wherein
    a width of the first semiconductor layer in a second region between adjacent pairs of the second gate electrodes in the second direction is less than a length of the first semiconductor layer in the second region.

2. The semiconductor device according to claim 1, wherein a value obtained by dividing the width by the length is less than or equal to 0.2.

3. The semiconductor device according to claim 1, wherein the first gate electrodes are connected to a first gate pad and the second gate electrodes are connected to a second gate pad.

4. The semiconductor device according to claim 1, further comprising:
    a first gate driver circuit connected to the first gate electrodes; and
    a second gate driver circuit connected to the second gate electrodes.

5. The semiconductor device according to claim 1, further comprising:
    a fifth semiconductor layer of the first conductivity type in the first region between the second semiconductor layer and the first semiconductor layer, a dopant concentration of the fifth semiconductor layer being greater than the first semiconductor layer.

6. The semiconductor device according to claim 5, further comprising:
    a sixth semiconductor layer of the first conductivity type in the first region, between the fourth semiconductor layer and the second gate electrode in the second direction, a dopant concentration of the sixth semiconductor layer being greater than the fifth semiconductor layer.

7. The semiconductor device according to claim 6, further comprising:
    a seventh semiconductor layer of the second conductivity type in the second region, the seventh semiconductor layer being between the first semiconductor layer and the first electrode in the first direction.

8. The semiconductor device according to claim 7, further comprising:
    an eighth semiconductor layer of the second conductivity type in the second region, the eighth semiconductor layer being between the seventh semiconductor layer and the first electrode, a dopant concentration of the eight semiconductor layer being greater than a dopant concentration of the seventh semiconductor layer.

9. The semiconductor device according to claim 1, further comprising:
    a fifth semiconductor layer of the first conductivity type in the first region, between the fourth semiconductor layer and a second gate electrode in the second direction, a dopant concentration of the fifth semiconductor layer being greater than the first semiconductor layer.

10. The semiconductor device according to claim 1, further comprising:
    a second pair of first gate electrodes, wherein the first pair of first gate electrodes is between the second pair of first gate electrodes in the second direction.

11. The semiconductor device according to claim 1, further comprising:
    a dummy electrode between a pair of second gate electrodes of the plurality of second gate electrodes in the second direction.

12. The semiconductor device according to claim 1, further comprising:
    a dummy electrode between one of the first gate electrodes of the first pair of first gate electrodes and the plurality of second gate electrodes in the second direction.

13. The semiconductor device according to claim 1, wherein the second semiconductor layer is in direct contact with the first electrode.

14. The semiconductor device according to claim 13, wherein the first electrode comprises least one of aluminum, tantalum, silver, molybdenum, tungsten, cobalt, chromium, ruthenium, gold, palladium, nickel, and platinum.

15. A semiconductor module, comprising:
    a voltage control circuit;
    a semiconductor device electrically connected to the voltage control circuit, the semiconductor device comprising:
        a first electrode spaced from a second electrode in a first direction;
        a first semiconductor layer of a first conductivity type between the first and second electrodes;

a first pair of first gate electrodes between the first and second electrodes and spaced from each other in a second direction intersecting the first direction, each first gate electrode extending in the first direction into the first semiconductor layer and surrounded by a first gate insulating film;

a plurality of second gate electrodes between the first pair of first gate electrodes in the second direction and spaced from each other in the second direction, each second gate electrode extending in the first direction between the first and second electrodes and surrounded by a second gate insulating film;

a second semiconductor layer of a second conductivity type on the first semiconductor layer in a first region between a first gate electrode of the first pair and one of the plurality of second gate electrodes;

a third semiconductor layer of the first conductivity type on the second semiconductor layer, the third semiconductor layer being directly adjacent to the first gate insulating film; and a fourth semiconductor layer of the second conductivity type on the second semiconductor layer adjacent to the third semiconductor layer in the second direction, wherein a width of the first semiconductor layer in a second region between adjacent pairs of the second gate electrodes in the second direction is less than a length of the first semiconductor layer in the second region, and the voltage control circuit is configured to control an on-state voltage applied to the first pair of first gate electrodes and an on-state voltage applied to the plurality of gate electrodes to be applied at different times.

16. The semiconductor module according to claim 15, wherein the on-state voltage applied to the first electrodes is applied until a predetermined time elapses from an ending of the application of the on-state voltage applied to plurality of second electrodes.

17. The semiconductor module according to claim 15, wherein the voltage control circuit comprises:

a first gate driver circuit connected to the first gate electrodes; and a second gate driver circuit connected to the second gate electrodes.

18. The semiconductor module according to claim 15, wherein the semiconductor device further comprises:

a fifth semiconductor layer of the first conductivity type in the first region between the second semiconductor layer and the first semiconductor layer, a dopant concentration of the fifth semiconductor layer being greater than the first semiconductor layer.

19. The semiconductor module according to claim 15, wherein the semiconductor device further comprises:

a second pair of first gate electrodes, wherein the first pair of first gate electrodes is between the second pair of first gate electrodes in the second direction.

20. The semiconductor module according to claim 15, wherein the semiconductor device further comprises:

a dummy electrode between one of the first gate electrodes of the first pair of first gate electrodes and the plurality of second gate electrodes in the second direction.

* * * * *